(12) United States Patent
Hata et al.

(10) Patent No.: US 10,096,566 B2
(45) Date of Patent: Oct. 9, 2018

(54) SEMICONDUCTOR DEVICE

(71) Applicant: Mitsubishi Electric Corporation, Tokyo (JP)

(72) Inventors: Yuki Hata, Tokyo (JP); Shintaro Araki, Tokyo (JP); Takaaki Shirasawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/305,811

(22) PCT Filed: Jul. 9, 2014

(86) PCT No.: PCT/JP2014/068297
§ 371 (c)(1),
(2) Date: Oct. 21, 2016

(87) PCT Pub. No.: WO2016/006054
PCT Pub. Date: Jan. 14, 2016

(65) Prior Publication Data
US 2017/0047265 A1   Feb. 16, 2017

(51) Int. Cl.
*H01L 23/34* (2006.01)
*H01L 21/00* (2006.01)
(Continued)

(52) U.S. Cl.
CPC ............. *H01L 24/33* (2013.01); *H01L 23/34* (2013.01); *H01L 25/07* (2013.01); *H01L 25/18* (2013.01); *H01L 2023/4062* (2013.01); *H01L 2023/4068* (2013.01); *H01L 2224/40137* (2013.01); *H01L 2224/48091* (2013.01); *H01L 2224/48247* (2013.01); *H01L 2224/73265* (2013.01);
(Continued)

(58) Field of Classification Search
CPC ................... H01L 23/3675; H01L 23/3735
USPC ................ 438/122; 257/675, 706, 712–722
See application file for complete search history.

(56) References Cited

U.S. PATENT DOCUMENTS 6,767,765 B2 *  7/2004  Chiu ..................... H01L 23/42
                                              438/122
9,502,342 B2 * 11/2016  Kim ................. H01L 23/49838
                                              21/565
2013/0200524 A1 *  8/2013  Han ....................... H01L 25/105
                                              257/774

FOREIGN PATENT DOCUMENTS

JP  2008-210829 A  9/2008
JP  2010-192717 A  9/2010
JP  2012-004358 A  1/2012

OTHER PUBLICATIONS

International Search Report issued in PCT/JP2014/068297; dated Oct. 7, 2014.
(Continued)

*Primary Examiner* — Calvin Lee
(74) *Attorney, Agent, or Firm* — Studebaker & Brackett PC

(57) ABSTRACT

A semiconductor device includes a semiconductor module having a semiconductor element, a radiator plate which is connected to the semiconductor element and which has at least one radiator plate through hole formed therein, and resin covering the semiconductor element and the radiator plate with a lower surface of the radiator plate exposed, a cooler, first insulating grease provided between the lower surface of the radiator plate and the cooler to thermally connect the radiator plate and the cooler, and second insulating grease provided in the at least one radiator plate through hole to be connected to the first insulating grease.

10 Claims, 9 Drawing Sheets

(51) Int. Cl.
  *H01L 23/00* (2006.01)
  *H01L 25/07* (2006.01)
  *H01L 25/18* (2006.01)
  *H01L 23/40* (2006.01)
(52) U.S. Cl.
  CPC .............. *H01L 2924/00014* (2013.01); *H01L 2924/13055* (2013.01); *H01L 2924/181* (2013.01)

(56) References Cited

OTHER PUBLICATIONS

Notification of Transmittal of Translation of the International Preliminary Report on Patentability and Translation of Written Opinion of the International Searching Authority; PCT/JP2014/068297 dated Jan. 19, 2017.
An Office Action; "Notification of Reasons for Refusal," issued by the Japanese Patent Office dated Nov. 21, 2017, which corresponds to Japanese Patent Application No. 2016-532833 and is related to U.S. Appl. No. 15/305,811; with English language translation.
An Office Action mailed by the State Intellectual Property Office of the People's Republic of China dated Jun. 1, 2018, which corresponds to Chinese Patent Application No. 201480080464.6 and is related to U.S. Appl. No. 15/305,811; with English translation.

* cited by examiner

SEMICONDUCTOR DEVICE

TECHNICAL FIELD

This invention relates to a semiconductor device which, for example, deals with a large current.

BACKGROUND

Patent Literature 1 discloses a semiconductor device in which a semiconductor module is fixed to a cooler.

PRIOR ART

Patent Literature

Patent Literature 1: Japanese Patent Laid-Open No. 2010-192717

SUMMARY

Technical Problem

To ensure heat dissipation capability for the semiconductor module, it is preferred that insulating grease is provided in a region between the semiconductor module and the cooler. However, the linear expansion coefficients of the semiconductor module and the cooler differ from each other. Accordingly, when the semiconductor module is used, the distance between the semiconductor module and the cooler changes with time. In some cases, this has caused a pumping out phenomenon in which the insulating grease escapes from the region between the semiconductor module and the cooler to the outside to allow air to enter the region between the semiconductor module and the cooler. There has been a problem that the heat dissipation capability of the semiconductor module cannot be maintained when air enters the region between the semiconductor module and the cooler.

The present invention has been accomplished to solve the above-described problem, and an object of the present invention is to provide a semiconductor device in which a decrease in the heat dissipation capability of a semiconductor module can be reduced.

Means for Solving the Problems

A semiconductor device according to the invention of the present application includes a semiconductor module having a semiconductor element, a radiator plate which is connected to the semiconductor element and which has at least one radiator plate through hole formed therein, and resin covering the semiconductor element and the radiator plate with a lower surface of the radiator plate exposed, a cooler, first insulating grease provided between the lower surface of the radiator plate and the cooler to thermally connect the radiator plate and the cooler, and second insulating grease provided in the at least one radiator plate through hole to be connected to the first insulating grease.

Another semiconductor device according to the invention of the present application includes a semiconductor module having a semiconductor element, a radiator plate connected to the semiconductor element, and resin covering the semiconductor element and the radiator plate with a lower surface of the radiator plate exposed, a cooler, an enclosing member enclosing a region including a region between the radiator plate and the cooler to create an enclosed region, and insulating grease filling the enclosed region.

Other features of the present invention will be made clear below.

Advantageous Effects of Invention

This invention can reduce the entry of air into a region between a semiconductor module and a cooler during the use of a semiconductor device, and can therefore reduce a decrease in the heat dissipation capability of the semiconductor module.

DESCRIPTION OF EMBODIMENTS

Semiconductor devices according to embodiments of the present invention will be described with reference to the drawings. The same or corresponding components will be denoted by the same reference signs, and the repetition of explanation thereof may be omitted.

Embodiment 1

Figure 1:
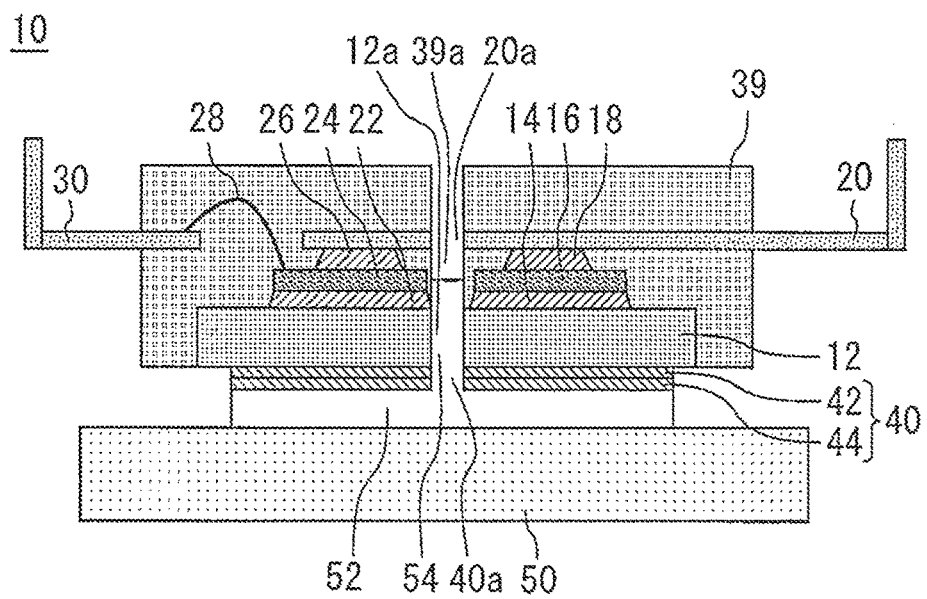
FIG. 1 is a cross-sectional view of a semiconductor device according to embodiment 1.

FIG. 1 is a cross-sectional view of a semiconductor device according to embodiment 1 of the present invention. A semiconductor device 10 includes a radiator plate 12 made primarily of, for example, Cu or Al. A semiconductor element 16 is connected to the radiator plate 12 with solder 14. The semiconductor element 16 is a diode having an anode formed on an upper surface thereof and a cathode formed on a lower surface thereof. A semiconductor element 24 is connected to the radiator plate 12 with solder 22. The semiconductor element 24 is an IGBT having an emitter and a gate formed on an upper surface thereof and a collector formed on a lower surface thereof.

A main terminal 20 is connected to the upper surface of the semiconductor element 16 with solder 18. This main terminal 20 is connected to the emitter of the semiconductor element 24 through solder 26. Control terminals 30 are connected to the gate of the semiconductor element 24 through wires 28.

The semiconductor elements 16 and 24, the radiator plate 12, and the like are covered with resin 39 such that a lower surface of the radiator plate 12 is exposed. An example of the resin 39 is epoxy resin. The main terminal 20 and the control terminals 30 extend from side surfaces of the resin 39 to the outside. The semiconductor elements 16 and 24, the radiator plate 12, the main terminal 20, the control terminals 30, and the resin 39 constitute one semiconductor module.

The radiator plate 12 has a radiator plate through hole 12a formed therein which passes through the radiator plate 12 in the thickness direction thereof. The resin 39 has a resin through hole 39a provided therein which communicates with the radiator plate through hole 12a. The main terminal 20 has a main terminal through hole 20a provided therein. All the three holes are provided to extend in the thickness direction of the semiconductor module. By forming the radiator plate through hole 12a, the resin through hole 39a, and the main terminal through hole 20a, a semiconductor module through hole is formed which passes through the semiconductor module.

An insulating sheet 40 is attached to the lower surface of the radiator plate 12. The insulating sheet 40 includes a first film 42 and a second film 44. A material for the insulating sheet 40 is not particularly limited as long as the insulating sheet 40 is made of a material having both electrical insulation and heat dissipation properties, and an example thereof is a ceramic material. The insulating sheet 40 has an insulating sheet through hole 40a formed therein which communicates with the radiator plate through hole 12a.

The semiconductor device 10 includes a cooler 50 for cooling the semiconductor module. First insulating grease 52 is provided in a region between the lower surface of the radiator plate 12 and the cooler 50. The region between the lower surface of the radiator plate 12 and the cooler 50 includes the insulating sheet through hole 40a. The first insulating grease 52 thermally connects the radiator plate 12 and the cooler 50. The first insulating grease 52 is made of a material having both electrical insulation and heat dissipation properties. Second insulating grease 54 is provided in the radiator plate through hole 12a to be connected to the first insulating grease 52. The second insulating grease 54 and the first insulating grease 52 are preferably made of the same material.

Figure 2:
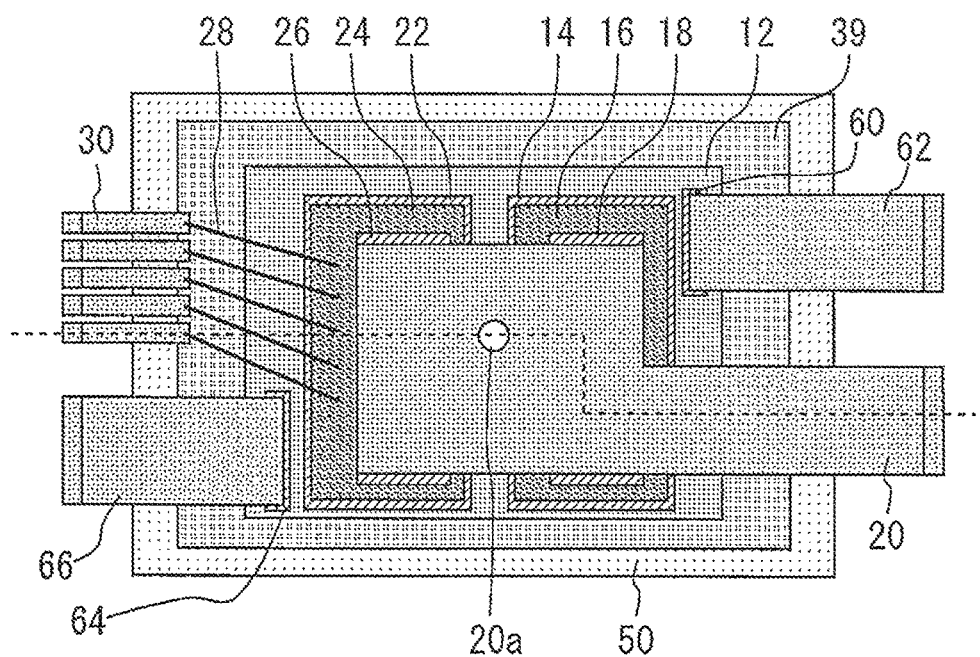
FIG. 2 is a plan view of the semiconductor device.

FIG. 2 is a plan view of the semiconductor device 10. FIG. 2 shows the inside of the resin 39 for convenience of explanation. The main terminal through hole 20a is formed at a center of the semiconductor device. The radiator plate 12 is connected to a main terminal 62 with solder 60. Moreover, the radiator plate 12 is connected to a main terminal 66 with solder 64. The main terminals 62 and 66 extend to the outside of the resin 39.

A method of manufacturing the semiconductor device 10 will be described. First, the main terminal 20 and the like are soldered with the main terminal through hole 20a located directly over the radiator plate through hole 12a to assemble a semiconductor module. The resin 39 having the resin through hole 39a is formed by molding to complete the semiconductor module.

Subsequently, the insulating sheet 40 is attached to the lower surface of the radiator plate 12 of the semiconductor module such that the radiator plate through hole 12a is superposed on the insulating sheet through hole 40a. Then, the first insulating grease 52 is placed on the cooler 50. Further, the insulating sheet 40 is brought into contact with an upper portion of the first insulating grease 52 to thermally connect the radiator plate 12 and the cooler 50.

Figure 3:
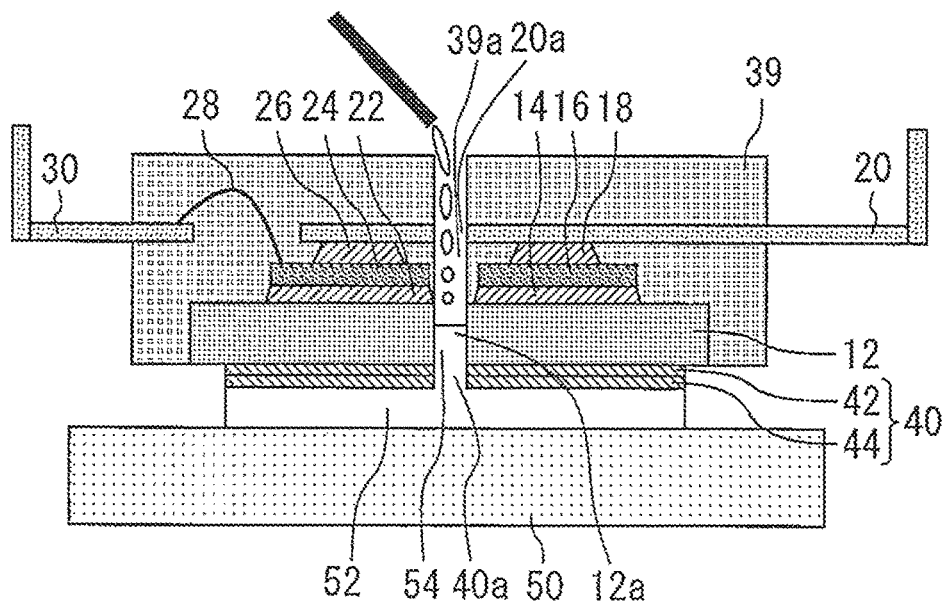
FIG. 3 is a cross-sectional view of the semiconductor device when the second insulating grease is injected.

After that, the second insulating grease 54 is placed in the radiator plate through hole 12a. FIG. 3 is a cross-sectional view of the semiconductor device when the second insulating grease is injected. The second insulating grease 54 is poured into the resin through hole 39a from above the semiconductor module. This brings the second insulating grease 54 into contact with the first insulating grease 52. Thus, the semiconductor device 10 shown in FIG. 1 is completed. It should be noted that FIG. 1 shows a state in which insulating grease is provided in the radiator plate through hole 12a and, to a small extent, also in the resin through hole 39a.

Figure 4:
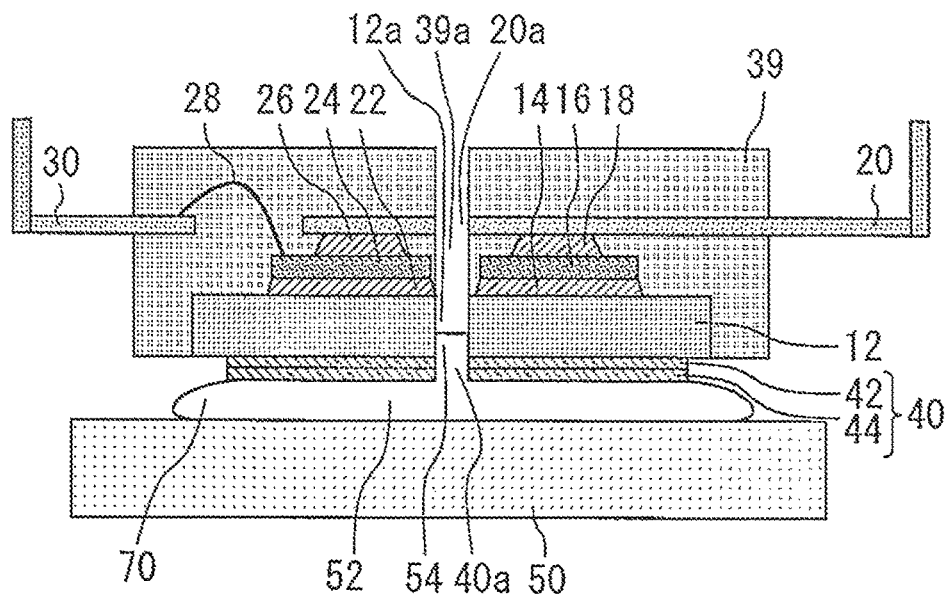
FIG. 4 shows the insulating grease spread.

When the semiconductor device repeatedly expands and contracts in association with the energization of the semiconductor module, the first insulating grease 52 is spread in directions toward the periphery of the first insulating grease 52. FIG. 4 shows the insulating grease 70 spread. There is a concern that when the first insulating grease 52 is spread in directions toward the periphery thereof, air enters a place where the first insulating grease 52 was before, and decreases the heat dissipation capability of the semiconductor module. However, in the semiconductor device 10 according to embodiment 1 of the present invention, the second insulating grease 54 compensates for the spread of the first insulating grease 52 as shown in FIG. 4. Accordingly, an empty space can be prevented from being created in a place where the first insulating grease 52 was before, between the radiator plate 12 and the cooler 50. Thus, a decrease in the heat dissipation capability of the semiconductor module can be reduced.

The semiconductor device 10 can be appropriately modified as long as the semiconductor device 10 includes second insulating grease which compensates for the spread of the first insulating grease 52. For example, insulating grease (second insulating grease) may be provided only in the radiator plate through hole 12a with the resin through hole 39a and the main terminal through hole 20a omitted. In that case, second insulating grease is placed in the radiator plate through hole 12a with the semiconductor module reversed, and then the semiconductor module is attached to the cooler 50.

A recessed portion may be provided in the radiator plate 12 instead of providing the radiator plate through hole 12a in the radiator plate 12, and second insulating grease may be provided in the recessed portion. However, while the width of the recessed portion is preferably as small as possible to ensure the rigidity of the semiconductor module, a recessed portion having a small width cannot contain a sufficient amount of second insulating grease. To ensure a sufficient amount of second insulating grease, it is preferred to form the radiator plate through hole 12a, not a recessed portion.

The main terminal 20 may be provided to avoid a region directly above the radiator plate through hole 12a, thus providing a semiconductor module through hole with the main terminal through hole 20a omitted. The insulating sheet 40 may be omitted. Moreover, the semiconductor module and the cooler 50 may be fixed to each other with screws or the like. In the case where the semiconductor module and the cooler 50 are fixed to each other with screws, a pumping out phenomenon can also occur, and the present invention is also effective.

These modifications can also be appropriately applied to semiconductor devices according to embodiments below. The semiconductor devices according to the embodiments below have many things in common with that of embodiment 1, and therefore differences from embodiment 1 will be mainly described.

Embodiment 2

Figure 5:
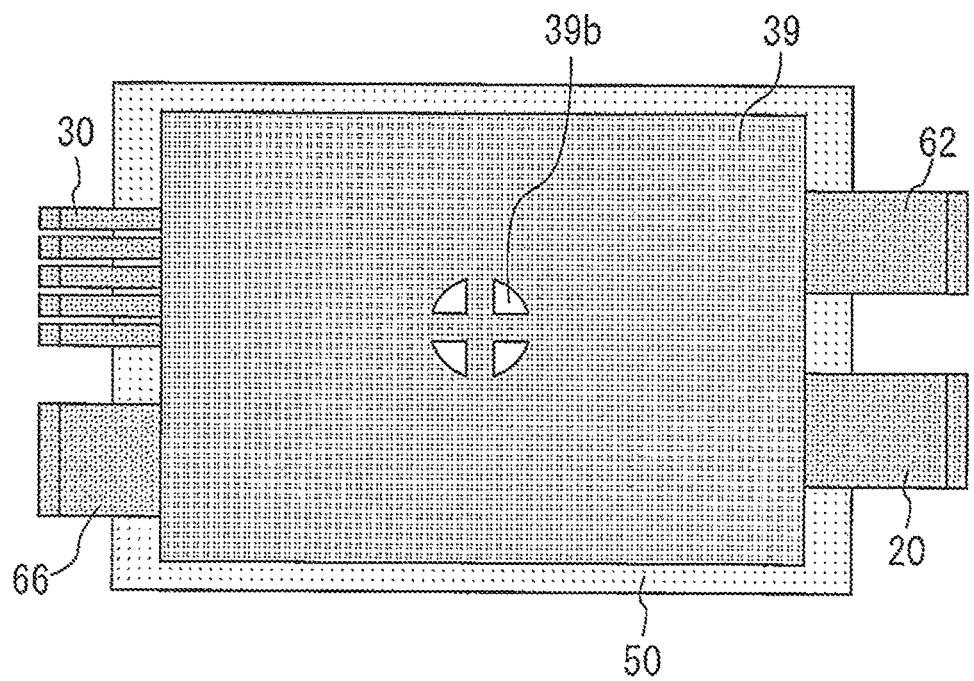
FIG. 5 is a plan view of a semiconductor device according to embodiment 2.

FIG. 5 is a plan view of a semiconductor device according to embodiment 2 of the present invention. A plurality of resin through holes 39b are provided. This semiconductor device has a plurality of semiconductor module through holes which are fan-shaped in planar view. To form a semiconductor module through hole or holes with the rigidity of the semiconductor module maintained, forming a plurality of semiconductor module through holes as in embodiment 2 is effective. It should be noted that semiconductor module through holes are not limited to being fan-shaped or circular in planar view.

Embodiment 3

Figure 6:
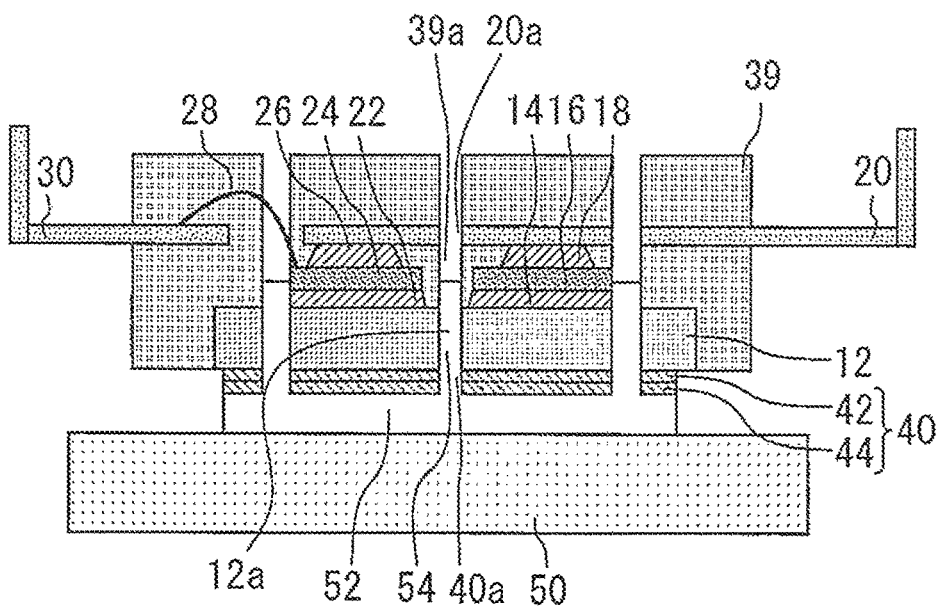
FIG. 6 is a cross-sectional view of a semiconductor device according to embodiment 3.
Figure 7:
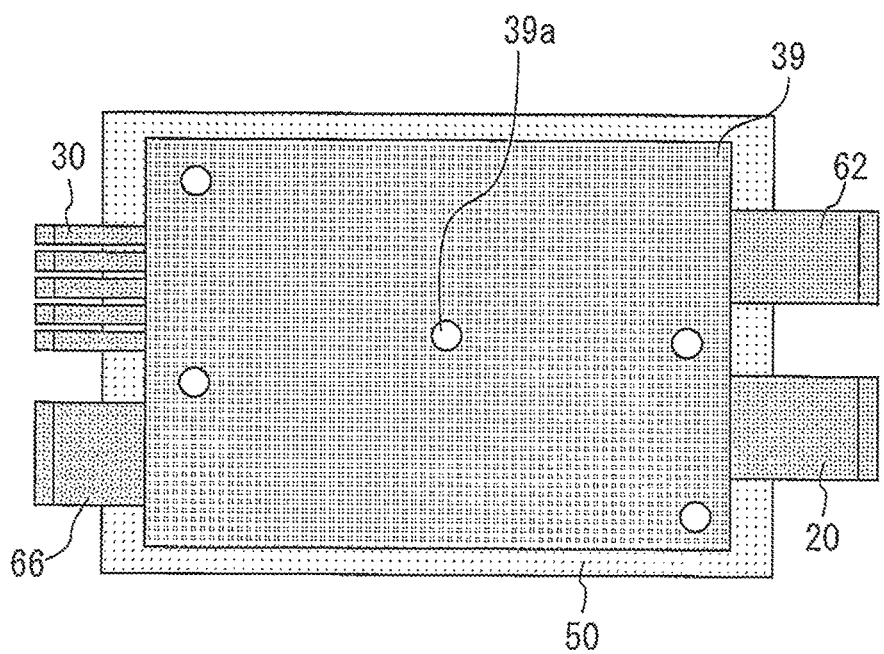
FIG. 7 is a plan view of the semiconductor device.

FIG. 6 is a cross-sectional view of a semiconductor device according to embodiment 3 of the present invention. A plurality of radiator plate through holes 12a, a plurality of resin through holes 39a, and a plurality of main terminal through holes 20a are provided. Second insulating grease 54 is also provided in a plurality of places to fill the insides of the radiator plate through holes 12a. FIG. 7 is a plan view of the semiconductor device of embodiment 3. Semiconductor module through holes are provided not only in a central portion of the semiconductor module but also in a peripheral portion thereof. The semiconductor module through holes in the peripheral portion are formed without providing through holes in the main terminals 20, 60, and 66 and the control terminals 30. Distributing the semiconductor module through holes to the central portion and the peripheral portion of the semiconductor module enables the second insulating grease 54 to rapidly compensate for the spread of the first insulating grease 52.

Embodiment 4

Figure 8:
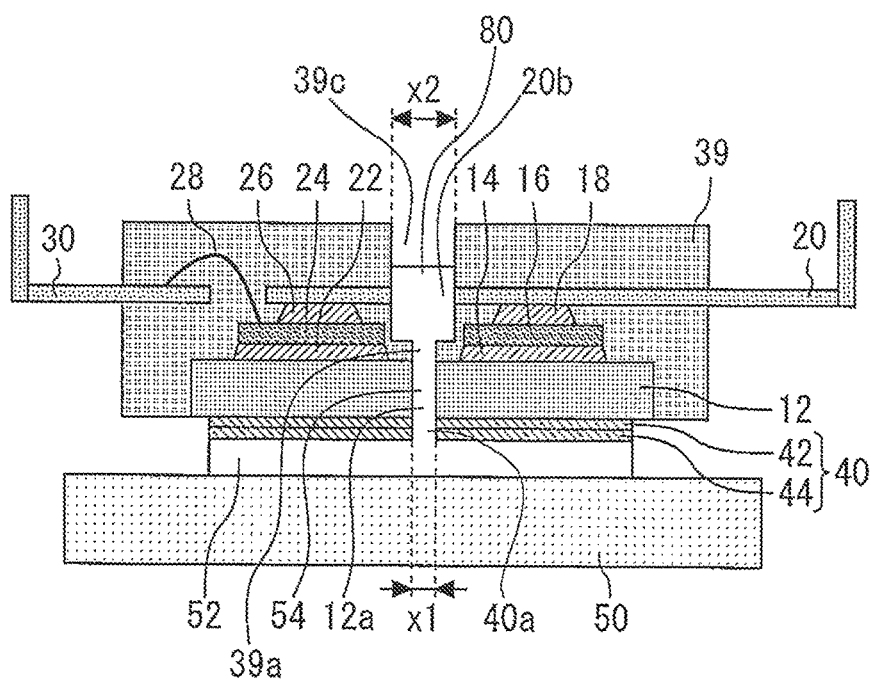
FIG. 8 is a cross-sectional view of a semiconductor device according to embodiment 4.

FIG. 8 is a cross-sectional view of a semiconductor device according to embodiment 4 of the present invention. The resin 39 has a wide portion 39c formed in at least part of the resin through hole 39a, the wide portion 39c having a larger width than the radiator plate through hole 12a. FIG. 8 indicates that the width of the radiator plate through hole 12a is x1 and that the width of the wide portion 39c is x2 which is larger than x1.

Third insulating grease 80 touching the second insulating grease 54 is provided in the resin through hole 39a. Part of the third insulating grease 80 is provided in the wide portion 39c which is part of the resin through hole 39a. The wide portion 39c has a larger width than the radiator plate through hole 12a, and can therefore contain a larger amount of insulating grease. Accordingly, even when the amount of the first insulating grease 52 spread is large, a sufficient amount of insulating grease can be added. Also, since the width of the radiator plate through hole 12a can be kept small, the rigidity of the semiconductor module can be maintained.

A recessed portion may be provided in the resin 39 instead of providing the resin through hole 39a, and third insulating grease may be provided in the recessed portion. In that case, the width of the recessed portion is preferably larger than the width of the radiator plate through hole 12a.

Embodiment 5

Figure 9:
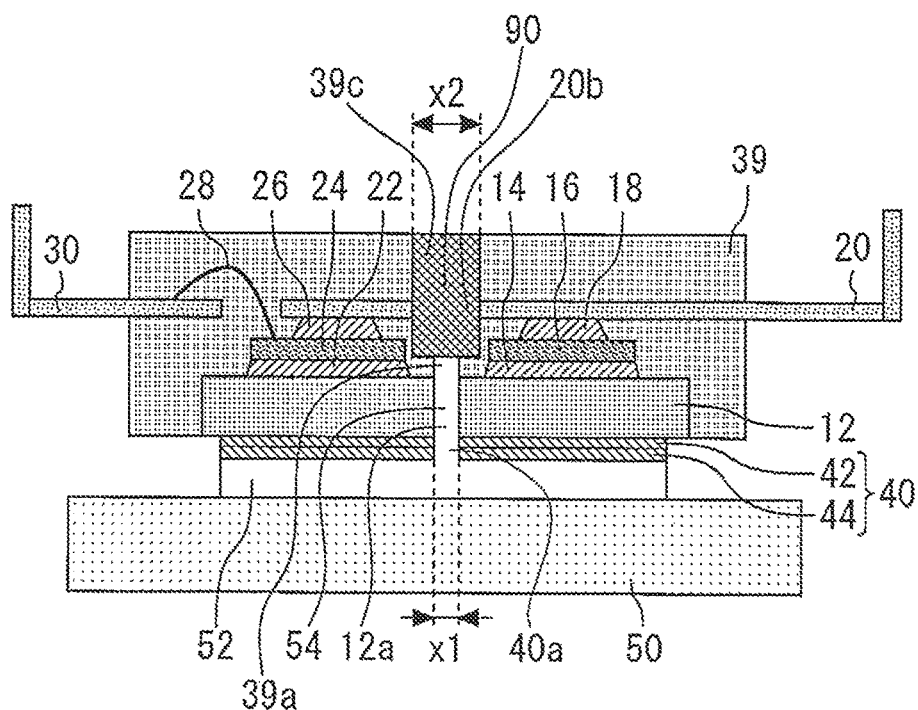
FIG. 9 is a cross-sectional view of a semiconductor device according to embodiment 5.

FIG. 9 is a cross-sectional view of a semiconductor device according to embodiment 5 of the present invention. This semiconductor device includes a stopper 90 for blocking at least part of the resin through hole 39a. The stopper 90 is tightly fitted into the wide portion 39c of the resin 39. It should be noted that the stopper 90 may be fixed to the resin 39 with adhesive or the like, or may be simply inserted into the resin through hole 39a. The stopper 90 can prevent the second insulating grease 54 from leaking upward through the resin through hole 39a.

Embodiment 6

Figure 10:
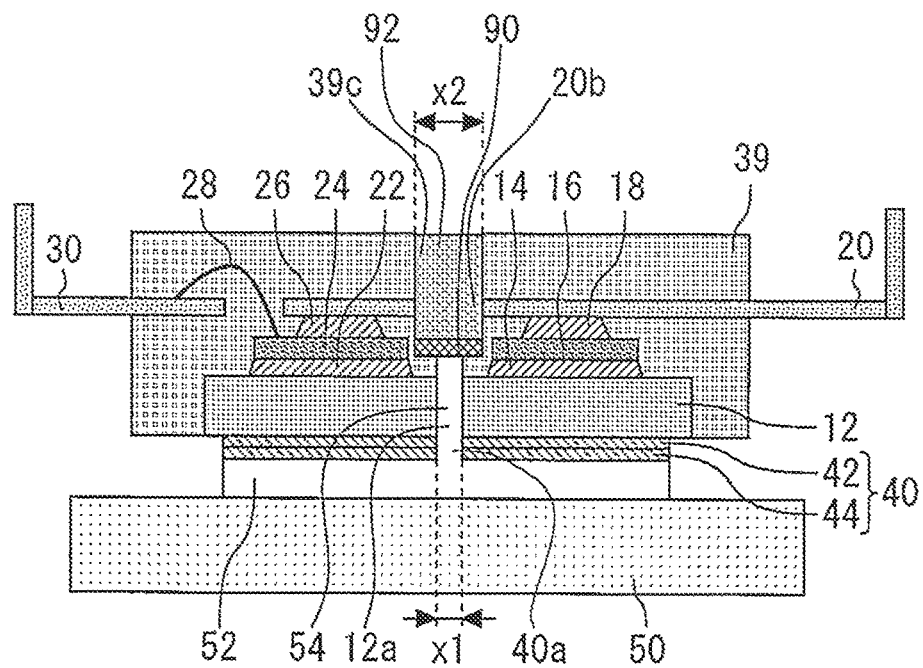
FIG. 10 is a cross-sectional view of a semiconductor device according to embodiment 6.

FIG. 10 is a cross-sectional view of a semiconductor device according to embodiment 6 of the present invention. This semiconductor device includes a gel 92 for fixing the stopper 90 in place. The gel 92 is provided in the resin through hole 39a so as to touch an upper surface of the stopper 90. Thus, the stopper 90 can be fixed in place.

Embodiment 7

Figure 11:
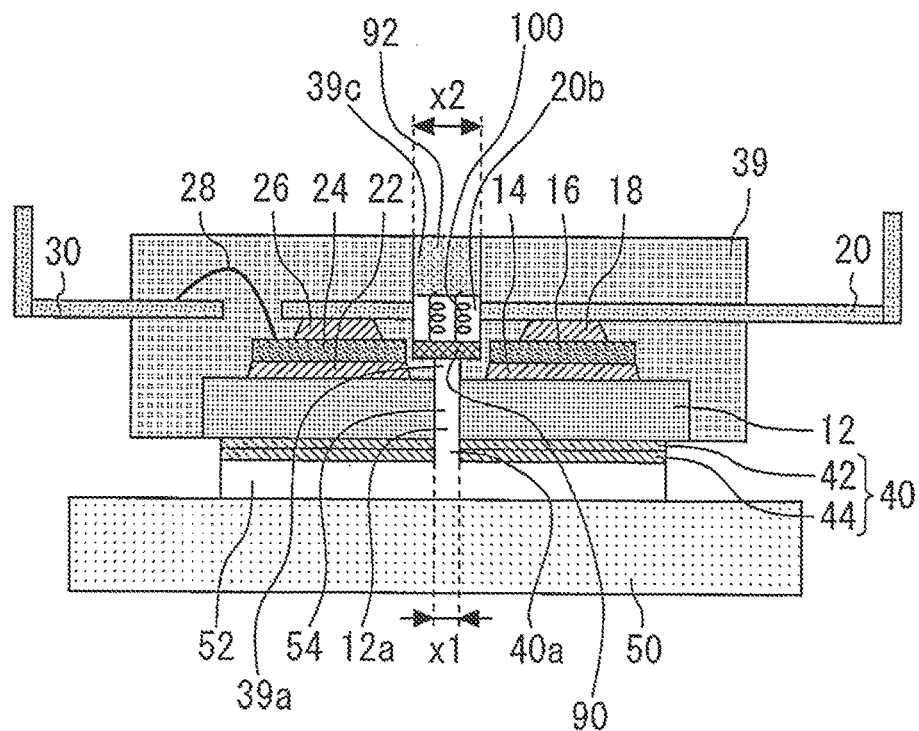
FIG. 11 is a cross-sectional view of a semiconductor device according to embodiment 7.

FIG. 11 is a cross-sectional view of a semiconductor device according to embodiment 7 of the present invention. The stopper 90 is provided in the resin through hole 39a (wide portion 39c) to be movable within the resin through hole 39a. Elastic bodies 100 formed by springs are provided on the stopper 90. The gel 92 fixed to the resin 39 is provided on the elastic bodies 100. When the stopper 90 moves in the direction away from the cooler 50 within the resin through hole 39a, the elastic bodies 100 are elastically deformed.

In the case where the stopper 90 is fixed to the resin 39, the approach of the semiconductor module and the cooler to each other forces the first insulating grease 52 to spread in directions toward the periphery thereof. However, in the semiconductor device according to embodiment 7 of the present invention, when the semiconductor module and the cooler 50 approach each other, the second insulating grease 54 exerts an upward force on the elastic bodies 100 to contract the elastic bodies 100. This causes the first insulating grease 52 to enter the radiator plate through hole 12a. After that, when the semiconductor module moves away from the cooler 50, the elastic bodies 100 expand to push the first insulating grease 52 in the radiator plate through hole 12a back into place (back into the region between the radiator plate 12 and the cooler 50). Thus, the spread of the first insulating grease 52 can be reduced. It should be noted that the elastic bodies 100 are not limited to springs as long as the elastic bodies 100 are elastically deformed, and may be made of, for example, rubber.

Embodiment 8

Figure 12:
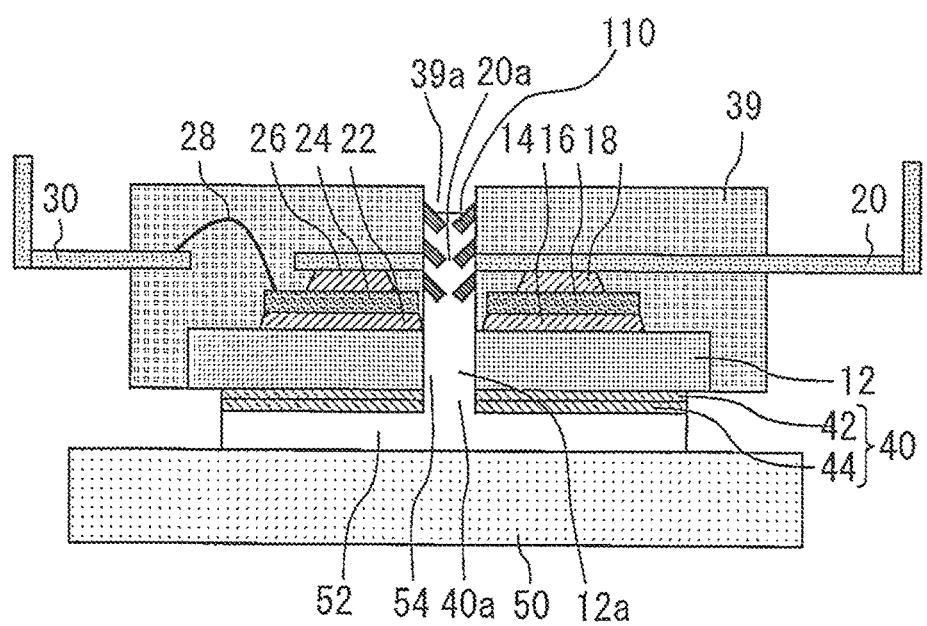
FIG. 12 is a cross-sectional view of a semiconductor device according to embodiment 8.

FIG. 12 is a cross-sectional view of a semiconductor device according to embodiment 8 of the present invention. First back flow preventers 110 are provided on a wall surface of the resin 39 which surrounds the resin through hole 39a to prevent the second insulating grease 54 from flowing in a direction away from the first insulating grease 52. The first back flow preventers 110 are made of, for example, resin. The first back flow preventers 110 can prevent the second insulating grease 54 from leaking from an upper portion of the semiconductor module.

Embodiment 9

Figure 13:
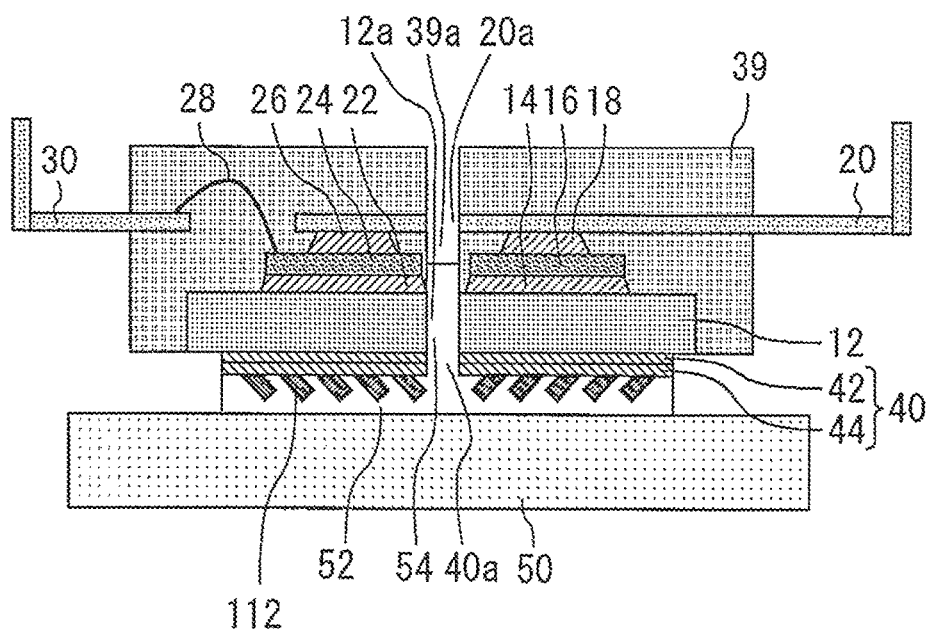
FIG. 13 is a cross-sectional view of a semiconductor device according to embodiment 9.
Figure 14:
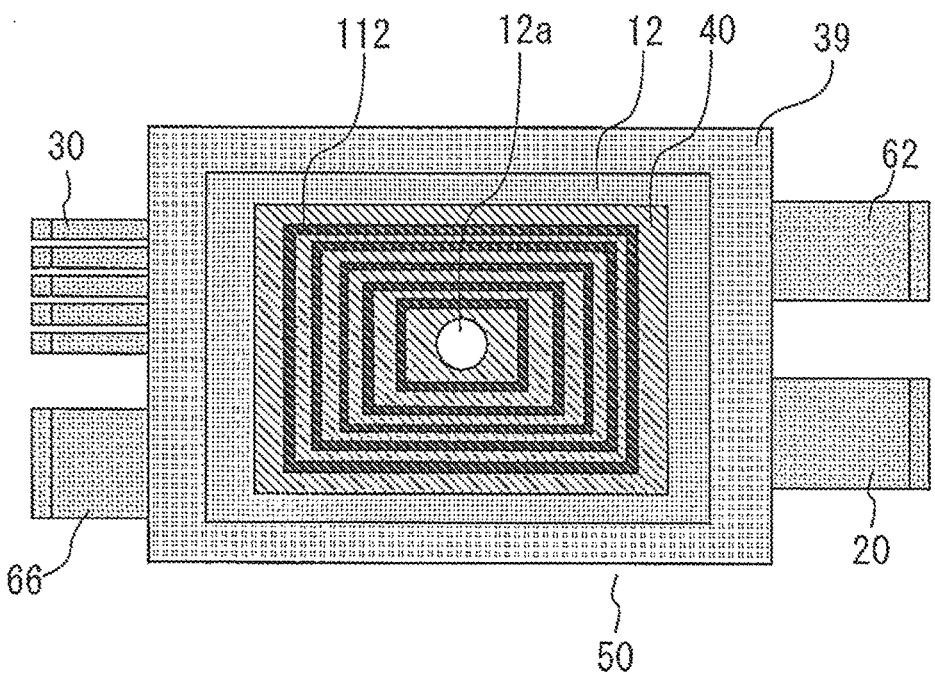
FIG. 14 is a bottom view showing the second back flow preventers.

FIG. 13 is a cross-sectional view of a semiconductor device according to embodiment 9 of the present invention. Second back flow preventers 112, which prevent the first insulating grease 52 from spreading in directions toward the periphery of the first insulating grease 52, are provided on a lower surface of the insulating sheet 40. FIG. 14 is a bottom view showing the second back flow preventers 112 and the like. The second back flow preventers 112 are narrow protrusions provided to surround the radiator plate through hole 12a in planar view. The second back flow preventers 112 are provided in looped shapes, and the number of the second back flow preventers 112 is two or more. The second back flow preventers 112 can reduce the flow of the first insulating grease 52 in directions toward the periphery thereof.

Figure 15:
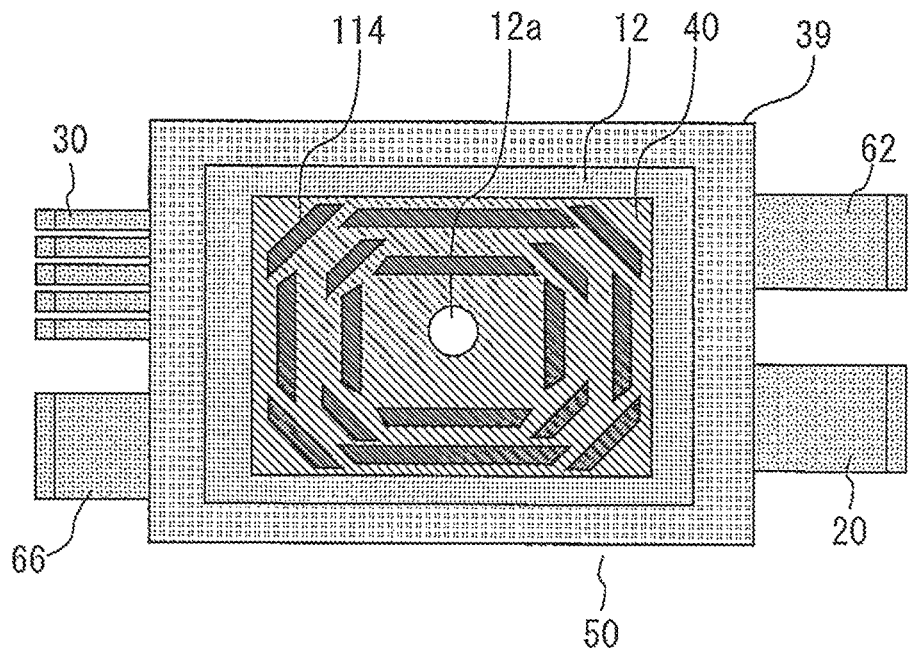
FIG. 15 shows variation of the second back flow preventers.

The second back flow preventers can be variously modified as long as the second back flow preventers are provided between the radiator plate 12 and the cooler 50 so as to prevent the first insulating grease 52 from spreading in directions toward the periphery of the first insulating grease 52. For example, second back flow preventers may be attached to the radiator plate 12 with the insulating sheet 40 omitted, or second back flow preventers may be attached to the cooler 50. Moreover, as shown in FIG. 15, a plurality of second back flow preventers 114 linearly formed may surround the radiator plate through hole 12a.

Embodiment 10

Figure 16:
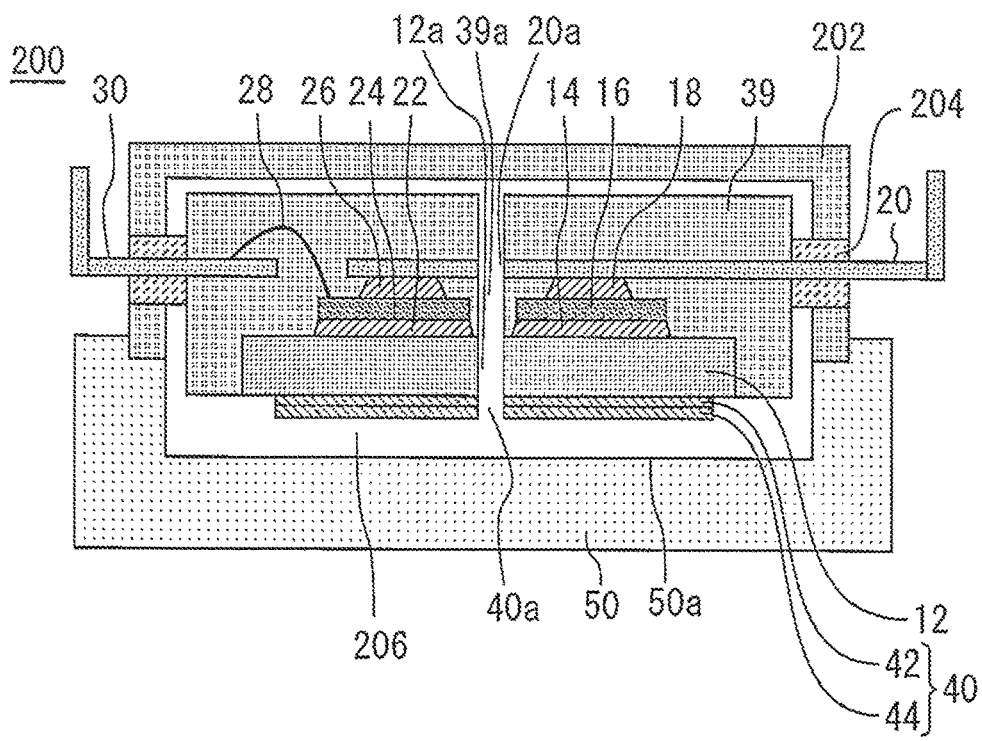
FIG. 16 is a cross-sectional view of a semiconductor device according to embodiment 10.

FIG. 16 is a cross-sectional view of a semiconductor device 200 according to embodiment 10 of the present invention. The semiconductor device 200 includes an enclosing member 202. The enclosing member 202 covers the resin 39 of the semiconductor module. Terminals (main terminal 20 and control terminals 30) of the semiconductor module pass through insulating material 204 touching the enclosing member 202 to extend to the outside of the enclosing member 202. A lower end portion of the enclosing member 202 is fixed to the cooler 50.

The enclosing member 202 forms an enclosed region which includes a region between the radiator plate 12 and the cooler 50, a region touching side surfaces of the semiconductor module, a region touching an upper surface of the semiconductor module, the radiator plate through hole 12a, and the resin through hole 39a. This enclosed region is one continuous region. The enclosed region is filled with insulating grease 206. It should be noted that a recessed portion 50a is provided in the cooler 50 and filled with the insulating grease 206.

Figure 17:
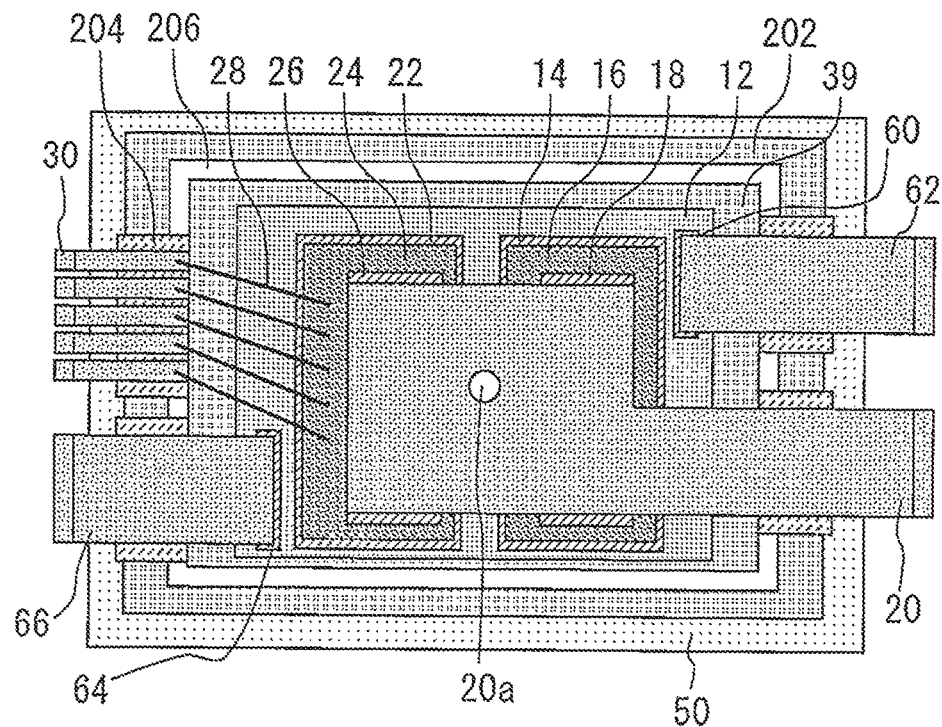
FIG. 17 is a plan view of the semiconductor device.

FIG. 17 is a plan view of the semiconductor device in FIG. 16. FIG. 17 shows the inside of the enclosing member 202. The insulating grease 206 surrounds the semiconductor module in planar view.

Since the insulating grease 206 fills the enclosed region, the insulating grease 206 between the radiator plate 12 and the cooler 50 is not lost. Accordingly, a decrease in the heat dissipation capability of the semiconductor module can be reduced. Further, when the insulating grease 206 between the radiator plate 12 and the cooler 50 is pushed out in directions toward the periphery thereof, the insulating grease 206 in the semiconductor module through hole is supplied to the region between the radiator plate 12 and the cooler 50. Thus, the insulating grease 206 circulates in the enclosed region. The circulation of the insulating grease 206 contributes to the improvement of the heat dissipation capability of the semiconductor module.

Figure 18:
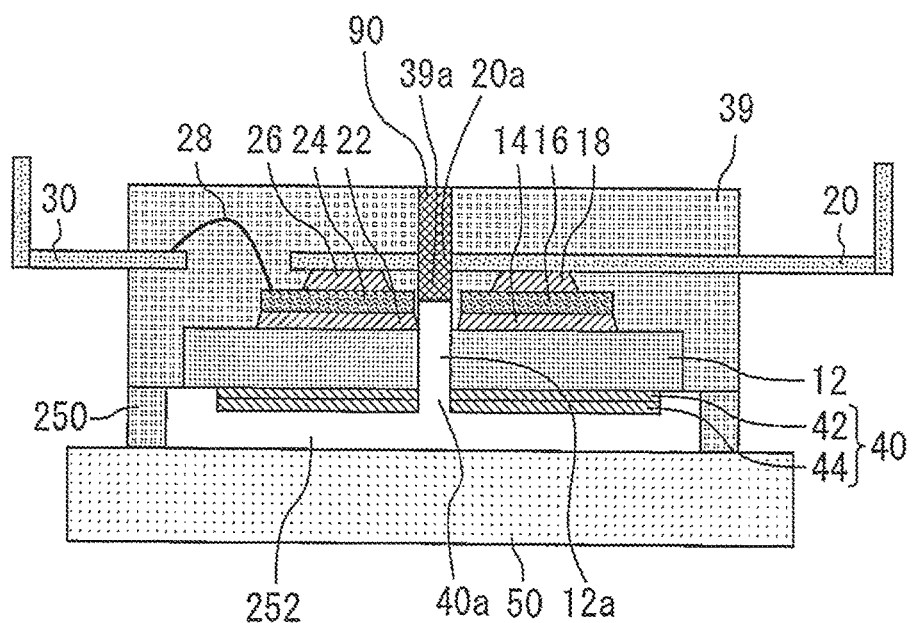
FIG. 18 is a cross-sectional view of a semiconductor device according to a modified example.

Various modifications can be made as long as an enclosed region is created by enclosing a region including the region between the radiator plate 12 and the cooler 50 with an enclosing member and filled with insulating grease. FIG. 18 is a cross-sectional view of a semiconductor device according to a modified example. An enclosing member 250 connects a lower end of the resin 39 and the cooler 50. This enclosing member 250 is formed in a looped shape so as to surround the region between the radiator plate 12 and the cooler 50. The stopper 90 and the enclosing member 250 form an enclosed region. The enclosed region is filled with insulating grease 252.

A material for an enclosing member is not particularly limited. However, if metal is used, heat dissipation effect can be expected to improve. The recessed portion 50a need not be formed in the cooler 50. It should be noted that features of the semiconductor devices according to the above-described embodiments may be appropriately combined.

DESCRIPTION OF SYMBOLS 10 semiconductor device, 12 radiator plate, 12a radiator plate through hole, 16 semiconductor element, 20 main terminal, 20a main terminal through hole, 24 semiconductor element, 30 control terminal, 39 resin, 39a,39b resin through hole, 39c wide portion, 40 insulating sheet, 40a insulating sheet through hole, 50 cooler, 52 first insulating grease, 54 second insulating grease, 80 third insulating grease, 90 stopper, 92 gel, 100 elastic bodies, 110 first back flow preventers, 112 second back flow preventers, 200 semiconductor device, 202,250 enclosing member, 204 insulating material, 206,252 insulating grease

The invention claimed is:

1. A semiconductor device comprising:
a semiconductor module comprising a semiconductor element, a radiator plate which is connected to the semiconductor element and which has at least one radiator plate through hole formed therein, and a resin covering the semiconductor element and the radiator plate with a lower surface of the radiator plate exposed;
a cooler;
a first insulating grease provided between the lower surface of the radiator plate and the cooler to thermally connect the radiator plate and the cooler; and
a second insulating grease provided in the at least one radiator plate through hole such that the second insulating grease is in direct contact with the first insulating grease.

2. The semiconductor device according to claim 1, wherein the at least one radiator plate through hole comprises a plurality of radiator plate through holes, and the second insulating grease is provided in a plurality of places.

3. The semiconductor device according to claim 1, further comprising a second back flow preventer provided between the radiator plate and the cooler to prevent the first insulating grease from spreading.

4. The semiconductor device according to claim 3, wherein the second back flow preventer is provided to surround the at least one radiator plate through hole in planar view.

5. The semiconductor device according to claim 1, wherein the resin has a resin through hole formed therein which communicates with the at least one radiator plate through hole.

6. The semiconductor device according to claim 5, further comprising a first back flow preventer provided on a wall surface of the resin to prevent the second insulating grease from flowing in a direction away from the first insulating grease, the wall surface surrounding the resin through hole.

7. The semiconductor device according to claim 5, wherein
- the resin has a wide portion formed in at least part of the resin through hole, the wide portion having a larger width than the at least one radiator plate through hole, and
- the wide portion has a third insulating grease provided therein.

8. The semiconductor device according to claim 5, further comprising a stopper for blocking at least part of the resin through hole.

9. The semiconductor device according to claim 8, further comprising an elastic body elastically deforming when the stopper moves in a direction away from the cooler within the resin through hole.

10. The semiconductor device according to claim 8, further comprising a gel for fixing the stopper in place.

* * * * *